United States Patent
Chen et al.

(10) Patent No.: US 11,271,567 B1
(45) Date of Patent: Mar. 8, 2022

(54) BURIED METAL TECHNIQUE FOR CRITICAL SIGNAL NETS

(71) Applicant: Arm Limited, Cambridge (GB)

(72) Inventors: Andy Wangkun Chen, Austin, TX (US); Sriram Thyagarajan, Austin, TX (US); Yew Keong Chong, Austin, TX (US); Sony, Noida (IN); Ettore Amirante, Nice (FR); Ayush Kulshrestha, New Delhi (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/013,199

(22) Filed: Sep. 4, 2020

(51) Int. Cl.
*H03K 19/17736* (2020.01)
*H03K 19/1776* (2020.01)

(52) U.S. Cl.
CPC ..... *H03K 19/1774* (2013.01); *H03K 19/1776* (2013.01)

(58) Field of Classification Search
None
See application file for complete search history.

(56) References Cited

U.S. PATENT DOCUMENTS

2020/0266169 A1* 8/2020 Kang ................ H01L 24/20

* cited by examiner

*Primary Examiner* — Jany Richardson
(74) *Attorney, Agent, or Firm* — Pramudji Law Group PLLC; Ari Pramudji

(57) ABSTRACT

Various implementations described herein are related to a device with a frontside power network and a backside power network. The frontside power network may include frontside supply rails coupled to logic circuitry, and also, the backside power network may include buried supply rails. Also, at least one buried supply rail of the buried supply rails may be used as a backside signal path for providing at least one critical signal net to the logic circuitry.

20 Claims, 6 Drawing Sheets

BURIED METAL TECHNIQUE FOR CRITICAL SIGNAL NETS

BACKGROUND

This section is intended to provide information relevant to understanding the various technologies described herein. As the section's title implies, this is a discussion of related art that should in no way imply that it is prior art. Generally, the related art may or may not be considered prior art. It should therefore be understood that any statement in this section should be read in this light, and not as any admission of prior art.

In some memory architecture designs, conventional power rails can be buried in memory, wherein metal power lines can be buried in the substrate, and these lines can be used as power rails for voltage distribution from backside circuitry. However, in these conventional memory designs, memory cells typically use frontside power rails for voltage distribution to frontside circuitry including the memory cells. Unfortunately, conventional memory designs are inefficient in that use of frontside power rails for memory cells suffers from area penalty in fabrication. Therefore, there exists a need to improve conventional memory designs to improve area efficiency of modern memory architecture.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are related to a cell architecture with buried power supply rails for backside delivery and distribution of power and critical signal nets in memory applications. The various schemes and techniques described herein may provide for a power distribution architecture that operates with frontside power distribution and backside power distribution for various logic applications. In some instances, various power distribution schemes and techniques described herein may provide frontside power rails and buried backside power rails that supply core voltage (VDD), ground (VSS), and critical signal nets to memory circuitry. Thus, in some implementations, the various power distribution schemes and techniques described herein may provide a logic device having a frontside power network with frontside supply rails coupled to logic circuitry and backside power network having buried supply rails, wherein at least one buried supply rail of the buried supply rails is configured as a backside signal path for providing a critical signal net to the logic circuitry. Also, in some implementations, the various power distribution schemes and techniques described herein may provide a cell architecture with frontside supply rails coupled to logic circuitry, backside supply rails, and buried transition vias that couple at least one backside supply rail to the logic circuitry to thereby provide a critical signal net to the logic circuitry. These aspects along with various other features, behaviors and characteristics are described in greater detail herein.

In some implementations, the various backside power distribution schemes and techniques described herein may provide for random access memory (RAM) applications including static RAM (SRAM). Therefore, various implementations described herein may provide for a novel cell architecture that utilizes buried metal for critical signals in SRAM applications. In reference to backside power domains for SRAM technology, metallization may be provided frontside (e.g., above a device) and also backside (e.g., below a device) as buried power rails. In the logic domain, the buried power rails may be used to supply power to memory components in a core array such that power domains are used to avoid area penalty. Various implementations described herein may also provide for an overall power domain scheme for memory applications, including, e.g., various use of backside-to-frontside transition cells having transition vias. These aspects along with various other features and characteristics are described in greater detail herein.

Various implementations of a cell architecture with a power distribution network associated with various power distribution schemes and techniques related thereto will be described in greater detail herein with reference to FIGS. 1-6.

Figure 1:
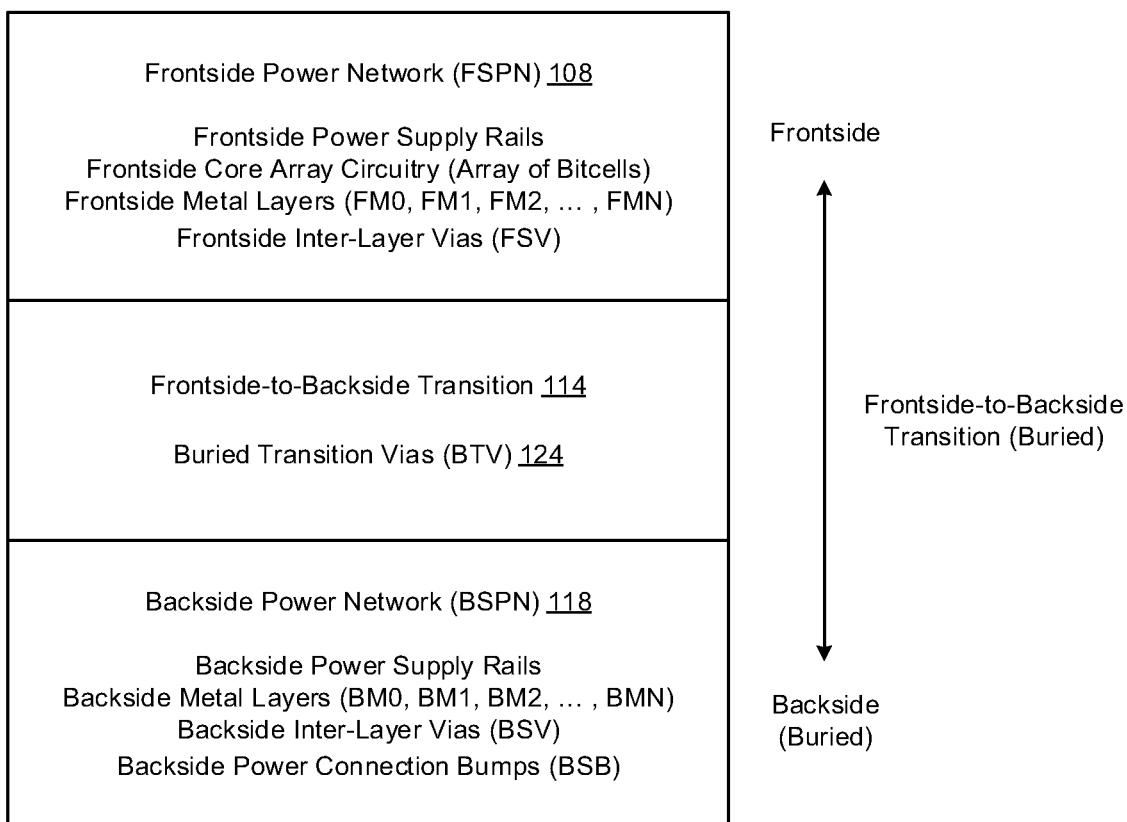
FIG. 1 illustrates a schematic diagram of buried power rail (BPR) architecture in accordance with various implementations described herein.

FIG. 1 illustrates a diagram 100 of buried power rail (BPR) architecture 104 in accordance with various implementations described herein.

In various implementations, the BPR architecture 104 may be implemented as a system or a device having various integrated circuit (IC) components that are arranged and coupled together as an assemblage or combination of parts that provide for a physical circuit design and related structures. In some instances, a method of designing, providing and building the BPR architecture 104 as an integrated system or device may involve use of various IC circuit components described herein to thereby implement various backside power distribution schemes and techniques associated therewith. The BPR architecture 104 may be integrated with computing circuitry and related components on a single chip, and the BPR architecture 104 may also be implemented in some embedded systems for automotive, electronic, mobile, server and Internet-of-things (IoT) applications.

As shown in FIG. 1, the BPR architecture 104 may include a frontside power network (FSPN) 108 having frontside power supply rails coupled to various components and/or logic circuits. In some instances, the frontside power supply rails may be coupled to logic circuitry associated with an array of bitcells arranged in columns and rows along with header logic and control logic. Also, the frontside power network (FSPN) 108 may include a number (N) of frontside metal layers (e.g., FM0, FM1, FM2, . . . , FMN) along with frontside inter-layer vias (FSV).

The BPR architecture 104 may include a backside power network (BSPN) 118 that provides power distribution for memory components, logic and/or circuitry, such as, e.g., an array of bitcells, column multiplexer circuitry (COLMUX), sense amplifier circuitry (SA), powergate input/output (PG I/O) circuitry, and powergate control (PG_CNTL). The backside power network (BSPN) 118 may be configured to provide power in one or more voltage domains for control logic disposed frontside. The power distribution network may be configured to supply core voltages, periphery voltages and/or ground.

In some implementations, the backside power network (BSPN) 118 may include backside metals layers (e.g., BM0). For instance, the backside power network (BSPN) 118 may include a backside power network with backside power rails. In some instances, one or more backside power rails may be used to supply a critical signal net to memory circuitry, including, e.g., logic disposed frontside. The backside power network (BSPN) 118 may also have backside metal layers (e.g., BM0, BM1, BM2, . . . , BMN) along with backside inter-layer vias (BSV). The backside power network (BSPN) 118 may include backside power connection bumps (BSB).

The BPR architecture 104 may include a frontside-to-backside transition 114 having buried transition vias (BTV) that are used for coupling the buried backside power network (BSPN) to the frontside power network (FSPN). The buried transition vias (BTV) 124 may be configured to provide a power transition between the backside power network (BSPN) 118 to the frontside power network (FSPN) 108. Thus, in some implementations, the BPR architecture 104 may be configured to transition the backside power rails of the backside power network to the frontside power rails of the frontside power network so as to thereby provide power taps to the memory circuitry from the backside power network (BSPN). In some instances, the buried transition vias may be used to transition a critical signal net from one or more backside power rails to memory circuitry, including, e.g., logic disposed frontside. The frontside-to-backside transition 114 may be referred to as buried transition architecture that may have backside-to-frontside transition cells with the buried transition vias 124 that provide a coupling transition between the backside power network (BSPN) 118 and the frontside power network (FSPN) 108.

In some implementations, the backside power rail (BPR) architecture 104 may be configured to operate as power distribution network architecture that uses backside buried metal in the backside power network for the backside power rails and also uses frontside metal of the frontside power network for the frontside power rails. The frontside power network (FSPN) utilizes frontside metal, and the backside power network (BSPN) utilizes backside buried metal disposed underneath the frontside metal of the frontside power network (FSPN). Also, the transition architecture may refer to buried transition vias disposed between the backside buried metal of the backside power network (BSPN) and the frontside metal of the frontside power network (FSPN).

In various implementations, the buried power rail (BPR) architecture 104 may refer to a novel cell architecture that provides buried metal for critical signal nets in some memory applications, such as, e.g., random access memory (RAM) including static RAM (SRAM). For instance, the novel cell architecture is configured to provide backside power distribution for memory circuitry (e.g., SRAM), wherein metallization is provided frontside above the memory circuitry and also backside below the memory circuitry as buried power rails. The novel cell architecture also utilizes buried metallization for backside-to-frontside transition cells that allows for backside distribution of power and critical signal nets to the memory circuitry disposed frontside. The backside power rails for memory may be buried in the substrate and related oxide layers, and these buried metal lines may be utilized as power rails for distributing power and/or signal lines for transmitting critical signals. These aspects and various other features, behaviors and characteristics are described herein in reference to FIGS. 2-6.

Figure 2:
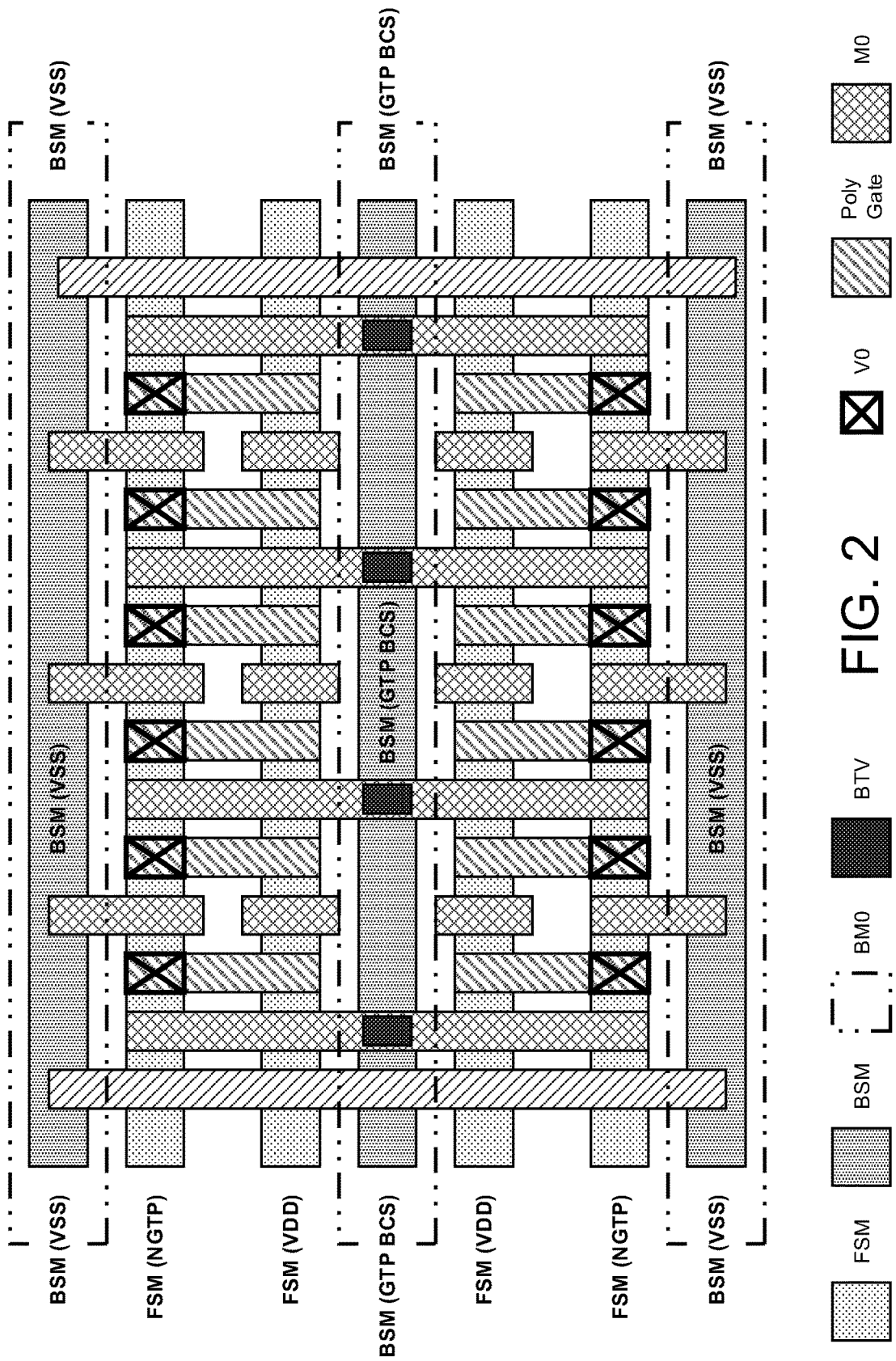
FIG. 2 illustrates a schematic diagram of cell architecture with buried critical signal line in accordance with various implementations described herein.

FIG. 2 illustrates a diagram 200 of cell architecture 204 with buried critical signal nets in accordance with implementations described herein. In some instances, the critical signal net may refer to various critical timing signals, such as e.g., a global timing pulse (GTP) or similar, that is provided from backside-to-frontside.

In various implementations, the cell architecture 204 may be implemented as a system or a device having various integrated circuit (IC) components that are arranged and coupled together as an assemblage or combination of parts that provide for a physical circuit design and related structures. In some instances, a method of designing, providing and building the cell architecture 204 as an integrated system or device may involve use of various IC circuit components described herein to thereby implement various backside power distribution techniques associated therewith. Also, the cell architecture 204 may be integrated with computing circuitry and related components on a single chip, and the cell architecture 204 may be implemented in various embedded systems for automotive, electronic, mobile, server and Internet-of-things (IoT) applications.

As shown in FIG. 2, the cell architecture 204 may include power distribution network (PDN) architecture having a frontside power network (FSPN) with frontside power rails and a backside power network (BSPN) with backside power rails. In some instances, the frontside power rails may be formed with frontside metal (FSM), and also, the frontside power rails may supply core voltage (VDD). In some instances, the backside power rails may be formed with buried backside metals (BSM), and the backside power rails may be coupled to ground (VSS). Also, in some instances, the backside power rails may provide a critical signal path for a backside critical signal (BCS), wherein the critical signal may refer to a critical timing signal, such as, e.g., a global timing pulse (GTP). Further, in some instances, the frontside power rails may provide another critical signal path for a frontside critical signal (FCS), wherein the critical signal may refer to another critical timing signal, such as, e.g., an inverted global timing pulse (NGTP).

The power distribution architecture may include buried transition vias (BTV) that provide a coupling transition from the backside power rails of the backside power network to the frontside power rails of the frontside power network. In some implementations, the buried transition vias (BTV) may provide power taps and/or critical signal taps by coupling the backside metals (BM0) of the backside power rails to the frontside metals (M0) of the frontside power rails. As such, the cell architecture 204 may be configured to provide the BTVs as various coupling transitions (i.e., power delivery transitions and/or critical signal transitions) between the backside power rails and frontside power rails so as to thereby provide power taps and/or critical signal taps to the frontside from the backside.

In various implementations, the frontside power network may be configured to use frontside metal (FS/M0) for frontside power rails and/or frontside signal lines. Also, the backside power network may be configured to use backside buried metal (BS/BM0) for backside power rails and/or backside signal lines, which are disposed underneath the frontside metal of the frontside power network. In some instances, the backside power rail architecture may be configured to operate as power distribution network architecture that uses the buried transition vias (BTV), which are disposed between the frontside metal (FS/M0) and the backside buried metal (BS/BM0).

In some implementations, the cell architecture 204 may include various other frontside signal lines (e.g., poly gate lines) for signal routing, and the cell architecture 204 may include the buried transition vias (BTV) that couple the poly gate lines to the buried supply rails (BS/BM0) in the backside power network. Also, the poly gate lines may be coupled to the frontside metal (FSM) by way of frontside vias (VO), and the backside metal (BSM) for the backside critical signal (BCS) may be coupled to the frontside metal (FS/M0) with the buried transition vias (BTV). These aspects and various other features, behaviors and characteristics are described herein in reference to FIG. 3.

Figure 3:
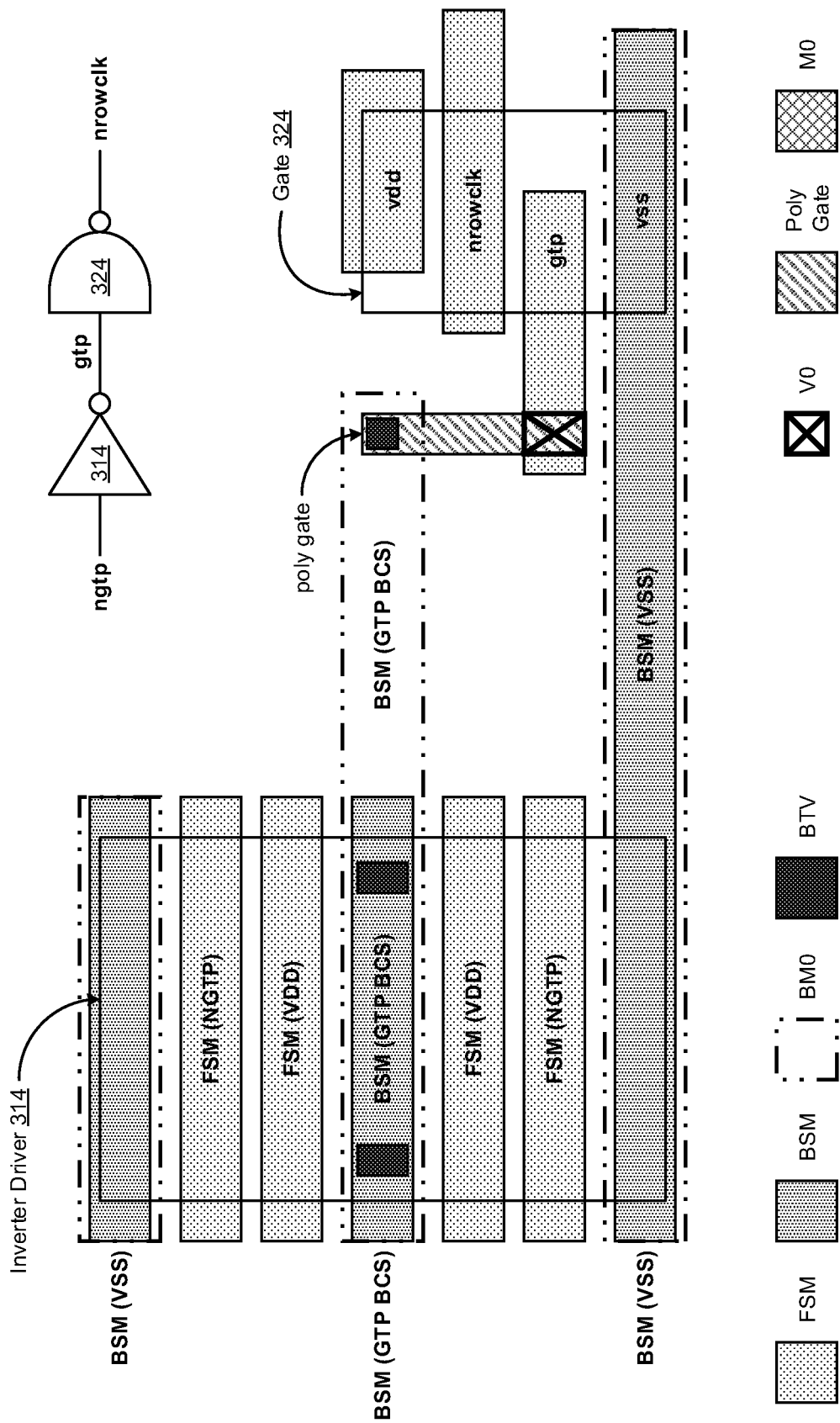
FIG. 3 illustrates a schematic diagram of signal routing in buried metal to gate in accordance with various implementations described herein.

FIG. 3 illustrates a diagram 300 of cell architecture 304 for signal routing in buried metal to gate in accordance with various implementations described herein.

As shown in FIG. 3, the cell architecture 304 may include various components and/or circuits, such as, e.g., an inverter driver 314 and a logic gate 324 (e.g., NAND gate) that are coupled together in series. In some instances, the inverter driver 314 may receive an ngtp signal as input and then provide a gtp signal to the logic gate 324, and also, the logic gate 324 may receive the gtp signal from the inverter driver 314 and then provide a row clk signal as output. This logic configuration is also shown with the power supply rail architecture having frontside metal (FSM) and backside metal (BSM). The inverter driver 314 is implemented similarly as the cell architecture 204 shown in FIG. 2.

In some implementations, the cell architecture 304 may have a frontside power network with frontside metal lines (FSM) formed into frontside supply rails coupled to logic circuitry (e.g., 314, 324). The cell architecture 304 may include a backside power network with backside metal lines (BSM) formed into buried supply rails. As shown in FIG. 3, at least one buried supply rail (BSM GTP BCS) of the buried supply rails may be used as a backside signal path for providing a backside critical signal net (BCS) between the logic circuitry (314, 324). In various instances, the cell architecture may refer to a standard cell architecture or a custom cell architecture. Also, the frontside power network has frontside metal layers (e.g., FSM (VDD)) that are configurable to provide the core voltage (VDD) or ground (VSS), and the backside power network has buried metal layers (e.g., BSM (VSS)) that are configurable to provide the backside signal path for the critical signal net (GTP BCS) and provide the core voltage (VDD) or ground (VSS).

The cell architecture 304 may include buried transition vias (BTV) that are used to couple the at least one buried supply rail (BSM GTP BCS) to frontside metals (FS/M0), wherein the buried transition vias (BTV) couple the at least one buried supply rail (BSM GTP BCS) to the logic circuitry (314, 324) to thereby provide the backside critical signal net (BCS) to the logic circuitry (314, 324) by way of coupling the backside signal path to the frontside metals (FS/M0). For instance, the inverter driver 314 has the buried supply rail (BSM GTP BCS) formed over and coupled to the backside metal (BS/BM0) by way of the buried transition vias (BTV), and also, the buried supply rail (BSM GTP BCS) extends toward and coupled to the logic gate (324) by way of the BTV to poly gate line and by way of the via (VO) to the gtp line. Also, the inverter driver 314 and the logic gate 324 share a backside metal line (BSM) that is coupled to ground (VSS).

The frontside supply rails may be formed with frontside metal (FSM), and also, the buried supply may be are formed with backside buried metal (BSM). The backside signal path for the GTP signal may be formed with the backside buried metal (BSM) that provides a buried signal path for the critical signal net (BSM GTP BCS). The critical signal net (BSM GTP BCS) may refer to the internal clock signal that is timing critical, such as, e.g., the global timing pulse (GTP). As shown in FIG. 3, the GTP signal is provide from the inverter driver 314 to the logic gate 324 by way of the backside buried metal (BSM) for the backside critical signal net (BSM GTP BCS). In some implementations, the critical signal net (GTP) is provided backside and refers to a first critical signal net, and at least one frontside supply rail of the frontside supply rails may be used as a frontside signal path for a second critical signal net (NGTP) that is complementary to the first critical signal net (GTP), wherein the second critical signal net refers to the inverted global timing signal (NGTP), which is complementary to the GTP signal.

Figure 4:
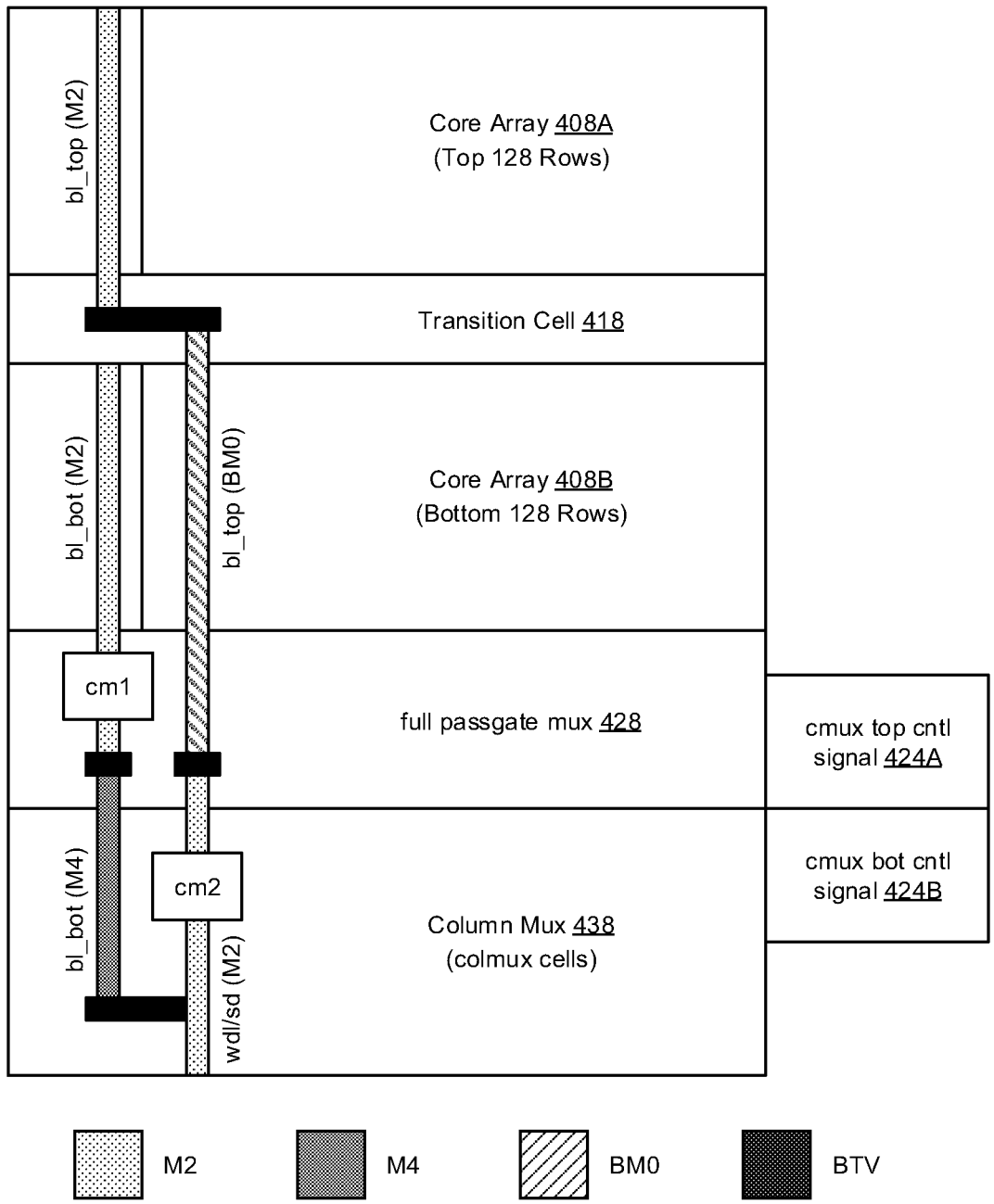
FIG. 4 illustrates a schematic diagram of a transition for flexible bitline (FBL) to frontside edge cell in accordance with various implementations described herein.

FIG. 4 illustrates a diagram 400 of cell architecture 404 for transition of flexible bitline (FBL) to frontside edge cell in accordance with various implementations described herein. In some implementations, the cell architecture 404 may be configured to transition the flexible bitline (FBL) with the global bitline (GBL) in backside metal (BSM).

As shown in FIG. 4, the cell architecture 404 may refer to memory circuitry having multiple core arrays 408A, 408B, transition cells 418, full passgate multiplexer 428, and a column multiplexer 438. The core arrays 408A, 408B may include an upper or top core array 408A having, e.g., an upper 128 rows, and the core arrays 408A, 408B may include a lower or bottom (bot) core array 408B having, e.g., a lower 128 rows. The core arrays 408A, 408B may be coupled together with a flexible bitline (FBL) formed in multiple frontside metal layers (FS/M2, FS/M4), wherein a portion of the flexible bitline (FBL) may be formed with backside metal (BM0). The full passgate multiplexer 428 may receive an upper (or top) column multiplexer (cmux) control signal 424A, and the column multiplexer 438 may receive a lower (or bot) column multiplexer (cmux) control signal 424B.

For instance, from the upper core array 408A, the upper portion of the bitline (bl_top) may be formed in the frontside metal (M2), and then the upper portion of the bitline (bl_top) may transition by way of the buried transition via (BTV) in the transition cell 218 to the backside portion of the bitline (bl_top) that is formed in the backside metal (BM0). Also, the backside portion of the of the bitline (bl_top) may then transition back to the frontside metal (M2) and couple to the column multiplexer (cm2), which provides the wordline data (wld) and/or source data (sd) output signal as output.

Also, in this instance, from the lower core array 408B, the lower portion of the bitline (bl_bot) may be formed in the frontside metal (M2), and then the lower portion of the bitline (bl_bot) may be coupled to the column multiplexer (cm1). The lower portion of the bitline (bl_bot) may then transition by way of the buried transition via (BTV) to another portion of the bitline (bl_bot) that is formed in another frontside metal (M4). The lower portion of the of the bitline (bl_bot) may then transition back to the frontside metal (M2) and couple to the column mux (cm2), which provides the wordline data (wld) and/or source data (sd) output signal as output.

In some implementations, the cell architecture 404 may use the flexible bitline (FBL) as the buried supply rail (BM0) for the portion of the upper bitline (bl_top), and the flexible bitline (FBL) may be used as the backside signal path for providing the critical signal net to the logic circuitry (e.g., so as to pass data from the upper core array 408A to the column multiplexer (cm2)). Also, in some instances, the buried transition vias (BTV) may be used to transition the flexible bitline (FBL) between the backside power rails (e.g., by way of BM0) and the frontside metal (e.g., FS/M2).

Figure 5:
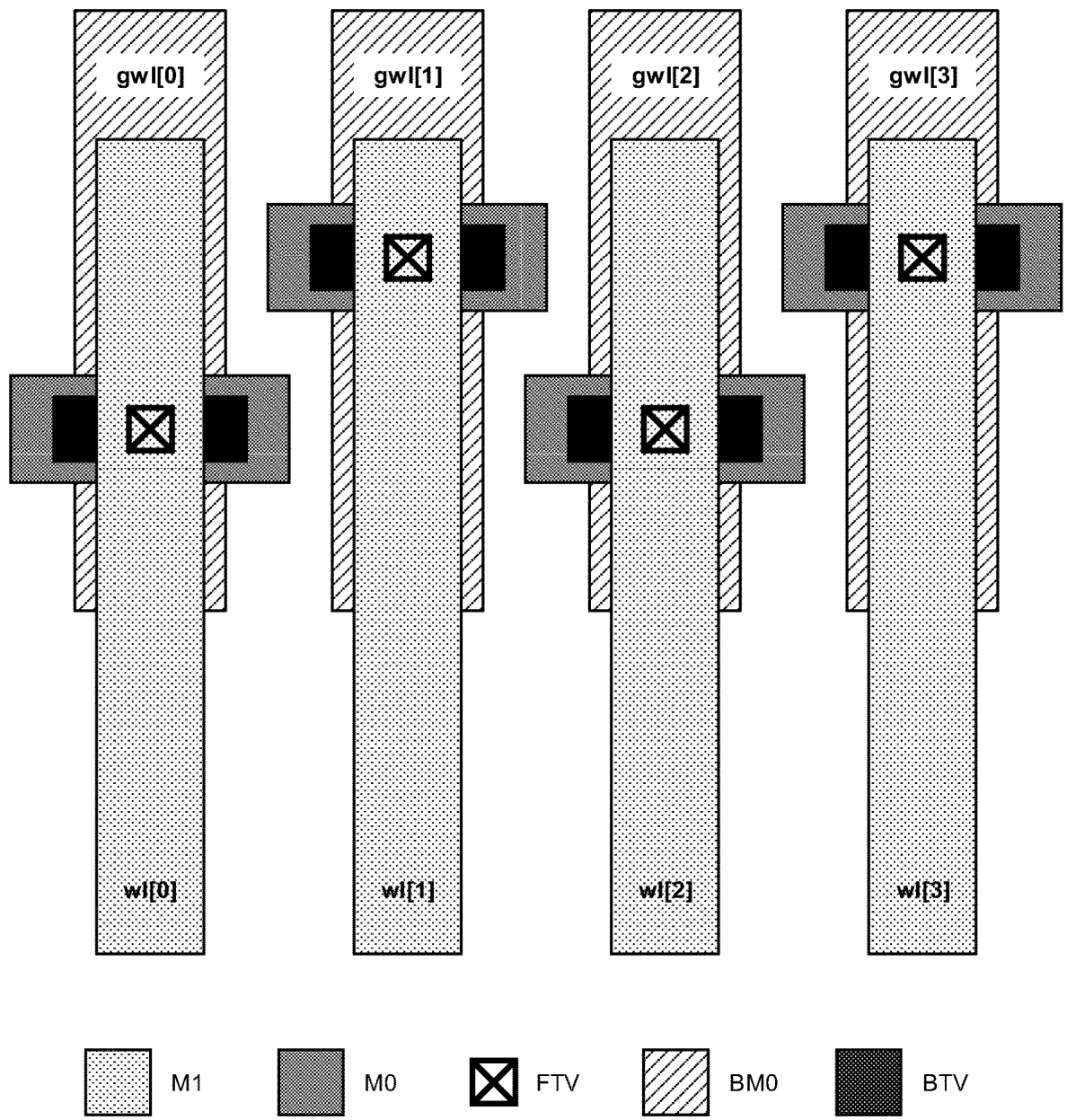
FIG. 5 illustrates a schematic diagram of a transition for global bitline (GBL) to frontside edge cell in accordance with various implementations described herein.

FIG. 5 illustrates a diagram 500 of cell architecture 504 for transition of global bitline (GBL) to frontside edge cell in accordance with various implementations described herein. In some implementations, the cell architecture 504 may be configured to transition the backside global bitline (GBL) (over core) to the frontside wordline (WL), which may then run periphery in the frontside.

As shown in FIG. 5, the cell architecture 504 may include backside metal lines (BSM) formed into buried supply rails for a critical signal, such as, e.g., the global wordline (GWL). For instance, a first global wordline (gwl[0]) may provide a first GWL signal in the backside metal (BM0), and the first global wordline (gwl[0]) may transition to the frontside metal (FS/M0) by way of the buried transition via (BTV). In some instances, the first global wordline (gwl[0]) may then further transition to another frontside metal (FS/M1) by way of a frontside transition via (FTV). Also, a second global wordline (gwl[1]) may provide a second GWL signal in the backside metal (BM0), and the second global wordline (gwl[1]) may transition to the frontside metal (FS/M0) by way of the buried transition via (BTV). In some instances, the second global wordline (gwl[1]) may then further transition to another frontside metal (FS/M1) by way of a frontside transition via (FTV).

Also, a third global wordline (gwl[2]) may provide a third GWL signal in the backside metal (BM0), and the third global wordline (gwl[2]) may transition to the frontside metal (FS/M0) by way of the buried transition via (BTV). In some instances, the third global wordline (gwl[2]) may then further transition to another frontside metal (FS/M1) by way of a frontside transition via (FTV). Also, a fourth global wordline (gwl[3]) may provide a fourth GWL signal in the backside metal (BM0), and the fourth global wordline (gwl[3]) may transition to the frontside metal (FS/M0) by way of the buried transition via (BTV). In some instances, the fourth global wordline (gwl[3]) may then further transition to another frontside metal (FS/M1) by way of a frontside transition via (FTV).

In some implementations, the cell architecture 504 may use the global wordline (GWL) as the buried supply rail (BM0), and also, the global wordline (GWL) may be used as the backside signal path for providing the critical signal net to logic circuitry. In some instances, the buried transition vias (BTV) may be used to transition the global wordline (GWL) between the backside power rails (BM0) and the frontside metals (M0, M1).

Figure 6:
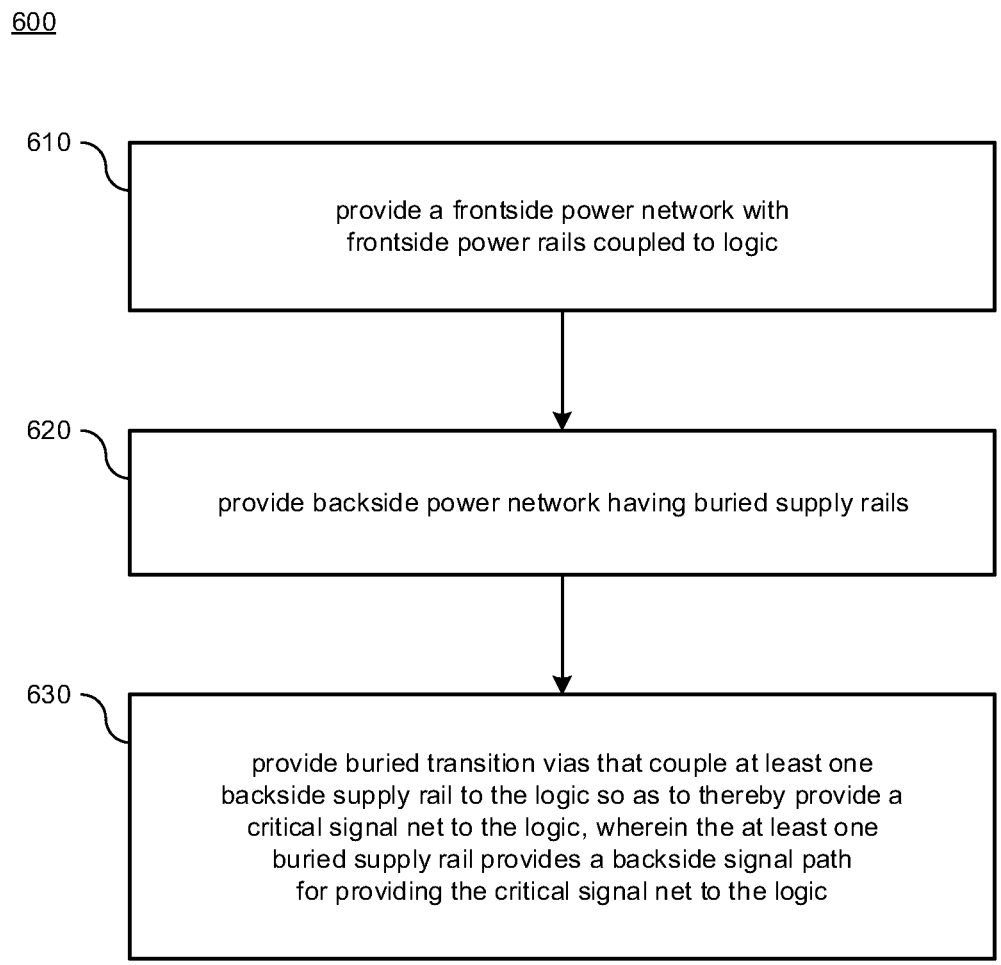
FIG. 6 illustrates a diagram of a method for providing buried power rail (BPR) architecture in accordance with implementations described herein.

FIG. 6 illustrates a process flow diagram of a method 600 for providing buried power rail (BPR) architecture in accordance with implementations described herein.

It should be understood that even though the method 600 indicates a particular order of operation execution, in some cases, various particular portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various components and/or circuitry, as described herein in reference to FIGS. 1-5. Also, if implemented in software, the method 600 may be implemented as a program and/or software instruction process configured for providing various backside power distribution schemes and techniques, as described herein. Also, if implemented in software, various instructions related to implementing method 600 may be stored in memory and/or a database. For instance, various types of computing devices having a processor and memory may be configured to perform method 600.

In various implementations, the method 600 may refer to a method of designing, providing, building, fabricating and/or manufacturing backside power rail architecture as an integrated system, device and/or circuit that may involve use of the various IC circuit components described herein so as to implement backside power distribution schemes and techniques associated therewith. In some implementations, the backside power rail architecture may be integrated with computing circuitry and other related components on a single chip, and the backside power distribution circuitry may be implemented in various embedded systems for automotive, electronic, mobile, server and Internet-of-things (IoT) applications, including remote sensor nodes.

At block 610, method 600 may provide a frontside power network with frontside power rails coupled to logic, and at block 620, method 600 may provide backside power network having buried supply rails. In various implementations, method 600 may be used to fabricate a logic based device with multiple power distribution networks, e.g., including the frontside power network and the backside power network, and the device may have a cell architecture, such as a standard cell architecture or a custom cell architecture. Also, the frontside supply rails may be formed with frontside metal, and the buried supply rails may be formed with backside buried metal. In some implementations, the frontside power network may be configured to provide a core voltage (VDD) and/or ground (VSS), and the backside power network may be configured to provide the backside signal path for the critical signal net and provide a core voltage (VDD) and/or ground (VSS).

At block 630, method 600 may provide buried transition vias that couple at least one backside supply rail to the logic so as to thereby provide a critical signal net to the logic. In some implementations, the at least one buried supply rail may provide a backside signal path for providing the critical signal net to the logic. Also, in some implementations, the backside signal path may be formed with backside buried metal that provides a buried signal path for the critical signal net, and the critical signal net refers to an internal clock signal that is timing critical. In some instances, the internal clock signal refers to a global timing pulse (GTP) that is provided to the logic, such as, e.g., a logic gate that is configured to receive the critical signal net and provide a row clock signal. Also, signal routing may be provided with the at least one buried supply rail to the logic gate as the backside signal path for providing the critical signal net to the logic gate.

In some implementations, the critical signal net may refer to a first critical signal net, and at least one frontside supply rail of the frontside supply rails is used as a frontside signal path for a second critical signal net that is complementary to the first critical signal net. The second critical signal net may refer to another global timing signal, such as, e.g., an inverted global timing signal (NGTP) that is complementary to GTP.

In some implementations, the cell architecture may have a flexible bitline (FBL) that is used as the at least one buried supply rail of the buried supply rails, and the flexible bitline (FBL) may be used as the backside signal path for providing the critical signal net to the logic circuitry. The cell architecture may include buried transition vias that transition the flexible bitline (FBL) between the backside power network and frontside metals.

In some implementations, the cell architecture may include a global wordline (GWL) that is used as the at least one buried supply rail of the buried supply rails, and the global wordline (GWL) may be used as the backside signal path for providing the critical signal net to the logic circuitry. Also, the cell architecture may have buried transition vias that transition the global wordline (GWL) between the backside power network and the frontside metals.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include frontside power network having frontside supply rails coupled to logic circuitry, and the device may include backside power network having buried supply rails. In some instances, at least one buried supply rail of the buried supply rails may be used as a backside signal path for providing a critical signal net to the logic circuitry.

Described herein are various implementations of a cell architecture. The cell architecture may include frontside supply rails coupled to logic circuitry, and also, the cell architecture may include backside supply rails. The cell architecture may include buried transition vias that couple at least one backside supply rail to the logic circuitry to thereby provide a critical signal net to the logic circuitry.

Described herein are various implementations of a method. The method may provide or fabricate a frontside power network with frontside power rails coupled to logic, and the method may provide or fabricate backside power network having buried supply rails. The method may provide or fabricate buried transition vias that couple at least one backside supply rail to the logic so as to thereby provide a critical signal net to the logic, wherein the at least one buried supply rail may provide a backside signal path for providing the critical signal net to the logic.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing refers to implementations of various techniques described herein, various other and further implementations may be devised in accordance with the disclosure herein, which may be determined by the claims that follow.

Although the subject matter has been described in language that is specific to various structural features and/or methodological acts, it is to be understood that subject matter defined in the appended claims is not necessarily limited to the specific features or acts described above. Rather, specific features and acts described above are disclosed as example forms of implementing the claims.

What is claimed is:

1. A device, comprising:
   frontside power network having frontside supply rails coupled to logic circuitry; and
   backside power network having buried supply rails;
   wherein at least one buried supply rail of the buried supply rails is used as a backside signal path for providing a critical signal net to the logic circuitry.

2. The device of claim 1, wherein the device has a cell architecture including a standard cell architecture or a custom cell architecture.

3. The device of claim 1, further comprising:
buried transition vias that couple the at least one buried supply rail to frontside metals,
wherein the buried transition vias couple the at least one buried supply rail to the logic circuitry to thereby provide the critical signal net to the logic circuitry by way of coupling the backside signal path to the frontside metals.

4. The device of claim 1, wherein:
the frontside supply rails are formed with frontside metal, and
the buried supply rails are formed with backside buried metal.

5. The device of claim 4, wherein:
the backside signal path is formed with a backside buried metal that provides a buried signal path for the critical signal net, and
the critical signal net refers to an internal clock signal that is timing critical.

6. The device of claim 5, wherein the internal clock signal refers to a global timing pulse (GTP) that is provided to the logic circuitry.

7. The device of claim 1, wherein:
the logic circuitry refers to a logic gate that is configured to receive the critical signal net and provide a row clock signal, and
signal routing is provided with the at least one buried supply rail to the logic gate as the backside signal path for providing the critical signal net to the logic gate.

8. The device of claim 1, wherein:
the critical signal net refers to a first critical signal net,
at least one frontside supply rail of the frontside supply rails is used as a frontside signal path for a second critical signal net that is complementary to the first critical signal net, and the second critical signal net refers to an inverted global timing signal (NGTP).

9. The device of claim 1, wherein:
the cell architecture includes a flexible bitline (FBL) that is used as the at least one buried supply rail of the buried supply rails, and
the flexible bitline (FBL) is used as the backside signal path for providing the critical signal net to the logic circuitry.

10. The device of claim 9, further comprising:
buried transition vias that transition the flexible bitline (FBL) between the backside power network and frontside metals.

11. The device of claim 1, wherein:
the cell architecture includes a global wordline (GWL) that is used as the at least one buried supply rail of the buried supply rails, and
the global wordline (GWL) is used as the backside signal path for providing the critical signal net to the logic circuitry.

12. The device of claim 11, further comprising:
buried transition vias that transition the global wordline (GWL) between the backside power network and the frontside metals.

13. The device of claim 1, wherein:
the frontside power network has frontside metal layers that are configurable to provide a core voltage (VDD) or ground (VSS), and
the backside power network has buried metal layers that are configurable to provide the backside signal path for the critical signal net and provide a core voltage (VDD) or ground (VSS).

14. A cell architecture, comprising:
frontside supply rails coupled to logic circuitry;
backside supply rails; and
buried transition vias that couple at least one backside supply rail to the logic circuitry to thereby provide a critical signal net to the logic circuitry.

15. The cell architecture of claim 14, wherein:
the frontside supply rails are formed with frontside metal,
the backside supply rails are formed with backside buried metal,
the buried transition vias are configured to couple the at least one buried supply rail to the frontside metal to thereby provide the critical signal net to the logic circuitry.

16. The cell architecture of claim 14, wherein:
the cell architecture includes a flexible bitline (FBL) that is used as the at least one buried supply rail of the buried supply rails, and
the flexible bitline (FBL) is used as the backside signal path for providing the critical signal net to the logic circuitry.

17. The cell architecture of claim 16, wherein:
the buried transition vias are used to transition the flexible bitline (FBL) between the backside power network and the frontside metals.

18. The cell architecture of claim 14, wherein:
the cell architecture includes a global wordline (GWL) that is used as the at least one buried supply rail of the buried supply rails, and
the global wordline (GWL) is used as the backside signal path for providing the critical signal net to the logic circuitry.

19. The cell architecture of claim 18, wherein:
the buried transition vias are used to transition the global wordline (GWL) between the backside power network and the frontside metals.

20. A method, comprising:
providing a frontside power network with frontside power rails coupled to logic;
providing backside power network having buried supply rails; and
providing buried transition vias that couple at least one backside supply rail to the logic so as to thereby provide a critical signal net to the logic,
wherein the at least one buried supply rail provides a backside signal path for providing the critical signal net to the logic.

* * * * *